United States Patent [19]

Yagi et al.

[11] Patent Number: 4,590,659
[45] Date of Patent: May 27, 1986

[54] APPARATUS FOR INSERTING SQUARE PINS INTO A PRINTED CIRCUIT BOARD

[75] Inventors: Hiroshi Yagi; Yoshio Harada, both of Tokyo, Japan

[73] Assignee: TDK Corporation, Japan

[21] Appl. No.: 486,423

[22] Filed: Apr. 19, 1983

[30] Foreign Application Priority Data

| Apr. 21, 1982 | [JP] | Japan | 57-66948 |
| May 4, 1982 | [JP] | Japan | 57-63835[U] |
| May 8, 1982 | [JP] | Japan | 57-66841[U] |
| May 15, 1982 | [JP] | Japan | 57-70968[U] |

[51] Int. Cl.⁴ .................. B23D 15/04; H05K 13/04
[52] U.S. Cl. .................... 29/564.6; 29/566.2; 29/739; 29/837; 227/94; 227/95
[58] Field of Search ............ 29/34 D, 564.2, 564.3, 29/564.6, 566, 566.1, 566.2, 739, 845, 884, 747, 760, 834, 850, 809, 835, 837, 839; 227/93, 142, 95, 116, 94

[56] References Cited

U.S. PATENT DOCUMENTS

| 3,710,480 | 1/1973 | Royse et al. | 29/566.2 X |
| 3,820,218 | 6/1974 | Serrano | 227/95 |
| 4,166,316 | 9/1979 | Misawa et al. | 29/739 X |
| 4,176,448 | 12/1979 | Zahn et al. | 29/739 X |
| 4,333,233 | 6/1982 | Dodson et al. | 29/747 X |
| 4,385,719 | 5/1983 | Erskine | 227/116 |
| 4,429,456 | 2/1984 | Zahn | 227/94 X |
| 4,501,065 | 2/1985 | Zemek et al. | 227/95 X |

FOREIGN PATENT DOCUMENTS

0102330 8/1981 Japan .................. 29/34 D

Primary Examiner—Gil Weidenfeld
Assistant Examiner—Glenn L. Webb
Attorney, Agent, or Firm—Steinberg & Raskin

[57] ABSTRACT

Apparatus for inserting square pins into a printed circuit board wherein during one stroke of a master cylinder, each square pin is cut by a movable cutter in combination with a fixed cutter from an elongated square pin-forming wire held in a chuck. The square pin is held by the movable cutter and then is moved over a guide member and then is further transferred into the guide member in accordance with the movement of a push rod moved by a main slider actuated by the master cylinder. The square pin is finally inserted into a printed circuit board by further movement of the push rod.

8 Claims, 10 Drawing Figures

APPARATUS FOR INSERTING SQUARE PINS INTO A PRINTED CIRCUIT BOARD

BACKGROUND OF THE INVENTION

The present invention relates to a square pin cutting and insertion apparatus for cutting a square pin-forming wire to a predetermined length, and then inserting the formed pin into a printed circuit board.

It will be understood that the terms "square pin-forming wire" and "square pin" refer to a wire and pin formed from a length thereof having substantially square or in some cases substantially rectangular transverse cross-sections.

Modern printed circuit board assembly techniques are requiring square pin insertion apparatus of the type with which the present invention is concerned to have increased rates of insertion of the square pins into the printed circuit board. However, conventional square pin insertion apparatus are virtually unable to satisfy such requirements, and moreover are of a complicated construction.

Furthermore, since defective square pin insertions resulting from deviations in the cross-sectional dimensions of the pin-forming wire as well as the presence of bends or burrs in the square pin-forming wire, reduce the practical value and reliability of such conventional apparatus, it has become necessary to consider possible counter-measures to take into account the presence of such cross-sectional deviations, bending, or burrs in the square pin-forming wire.

In addition, it has also been found that the provision of supporting structure for the printed circuit board is important with a view to preventing cracks being formed in the board during the insertion of square pins therein.

SUMMARY OF THE INVENTION

With the above background, the present invention provides a square pin insertion apparatus which is capable of executing a complete cycle during a single stroke of a master cylinder for carrying out the principal operations from the cutting of the square pin-forming wire to a certain predetermined length to form the square pin to the insertion of the square pin cut from the wire into a printed circuit board, realizing an increase in the square pin insertion rate, and a significant simplification in the construction of the apparatus.

It is another object of the present invention to provide a square pin insertion apparatus which has an increased reliability obtained by allowing for increased tolerances in the square pin-forming wire dimensions.

It is a further object of the present invention to provide a square pin insertion apparatus which has an increased reliability by providing a new construction for a board-supporting component part of the square pin insertion apparatus to prevent cracking of the board, or separation of the circuit pattern printed thereon.

Briefly, in accordance with the present invention, an apparatus is provided for inserting the square pins into a printed circuit board. The apparatus comprises a master cylinder, a main slider operated by the master cylinder, a push rod and slide bar provided on the main slider, a guide member provided at the end of the slide bar, a chuck slider operated by the main slider when it has moved a predetermined distance, a chuck provided on the chuck slider which is capable of holding a length of square pin-forming wire before it is cut, a fixed cutter and a movable cutter provided to cut the square pin-forming wire in combination with said fixed cutter.

The movable cutter holds a square pin cut from the square pin-forming wire and transfers it to an upper position over the guide member. The square pin is then further transferred into the guide member by the movement of the push rod which is activated by the main slider. Thereafter, the square pin is inserted into the printed circuit board by the movement of the push rod.

In accordance with a preferred embodiment of the invention, the chuck moves while holding the square pin-forming wire during the time the push rod is transferring the already formed square pin as described above to supply a new end portion of the square pin wire to the movable cutter.

In the preferred embodiment, the apparatus further includes a board support means provided below the printed circuit board and comprising a pair of board-supporting levers, the ends of which being actuatable in a closing direction, and a cylinder which elevates the board-supporting levers when a square pin is being inserted so that the levers come into contact with the lower surface of the printed circuit board, whereupon the board-supporting levers hold the end of the square pin which protrudes from the lower surface of the printed circuit board.

BRIEF DESCRIPTION OF THE DRAWINGS

A more complete appreciation of the invention and many of the attendant advantages thereof will be readily understood by reference to the following detailed description when considered in connection with the accompanying drawings in which.

DETAILED DESCRIPTION OF THE PREFERRED EMBODIMENT

The preferred embodiment of a square pin insertion apparatus to which the present invention is applied is explained below in detail with reference to the accompanying drawings.

Figure 1:
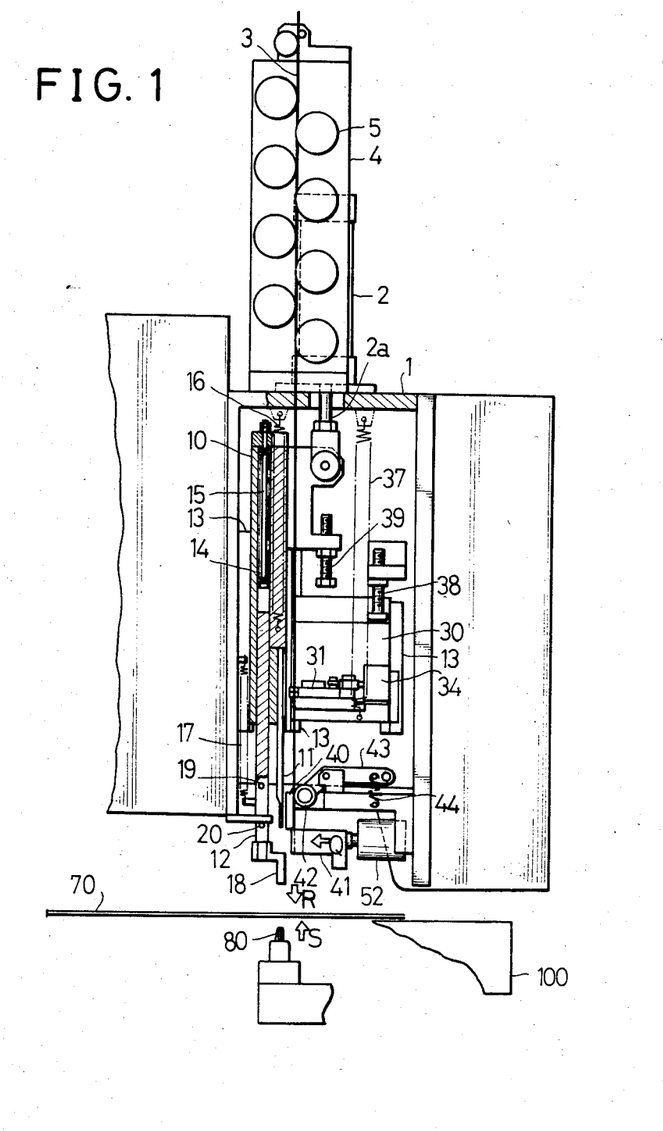
FIG. 1 is a front elevation view in partial section of the complete construction or assembly of an embodiment of a square pin insertion apparatus according to the present invention.

FIG. 1 shows the complete construction of the preferred embodiment. A master cylinder 2 and a wire straightener 4 for the square pin-forming wire are fixedly mounted at the upper part of a frame 1 of the apparatus. The wire straightener 4 includes several pulleys 5 arranged in two parallel, vertical columns and function to straighten the square pin-forming wire 3, if it is bent, as it is supplied from a supply reel (not shown) on which the square pin-forming wire 3 is wound.

The end of a piston rod 2a of the master cylinder 2 is coupled to a main slider 10. A push rod 11 is fixed to the lower end of the main slider 10 and a slide bar 12 is inserted within a longitudinal bore thereof so that it is freely slidable in the vertical direction. The main slider 10 is supported by a rail 13 so that it is itself freely slidable in the vertical direction with respect to the frame 1 of the apparatus. The upper end of the slide bar 12 is located in spaced, opposed relationship to the lower end of a receiving rod 15 forming a part of the main slider 10 and which is provided with a compression spring 14 around its periphery, these ends being spaced from each other by a gap of a certain length. This gap provides a delay between the downward movement of the slide bar 12 and that of the push rod 11. In addition, a tension spring 16 is provided in a manner such that it tends to pull the main slider 10 in an upward direction while a tension spring 17 is provided in a manner such that it tends to pull the slide bar 12 upward. A guide 18 for holding and guiding square pins cut from the square pin-forming wire as described hereinbelow, is fixed to the lower end of the slide bar 12, and spaced stop pins 19, 20 are fixed to the side of the slide bar 12 in order to limit its movement, also as described below.

Figure 2:
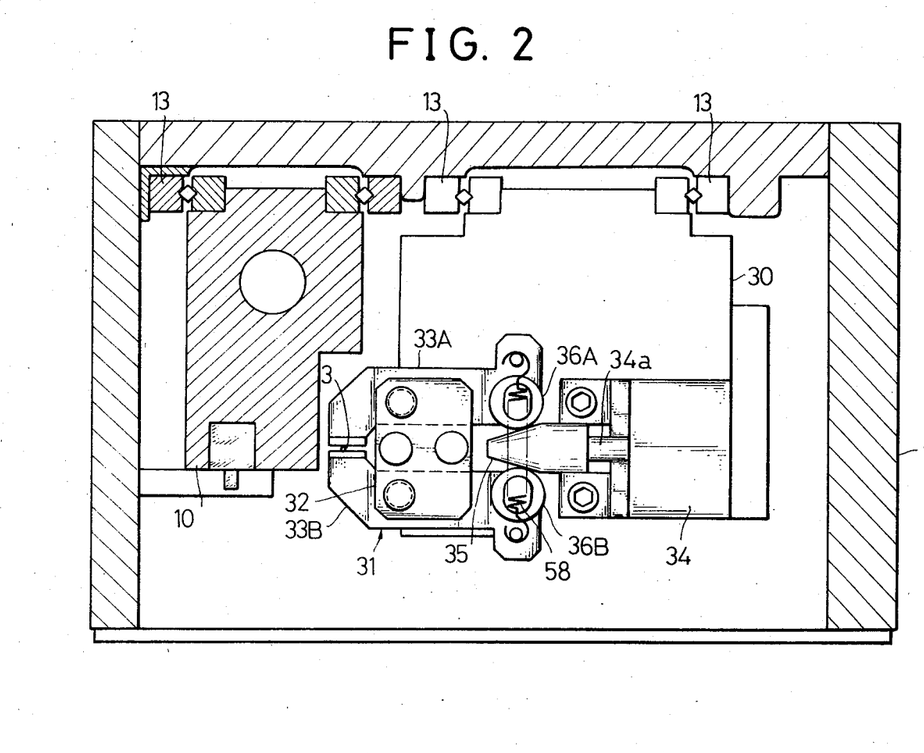
FIG. 2 is a plan view of a chuck constituting a component part of the present invention.

A chuck slider 30 mounted for free sliding movement along the frame 1 in the vertical direction is provided with a chuck 31 for holding or clamping the square pin-forming wire 3 which has passed through the wire straightener 4. More particularly, referring to FIG. 2, the chuck slider 30 is supported by vertical rails 13 so that it is freely slidable. A pair of holding or clamping levers 33A, 33B of the chuck 31 are pivotally mounted on the chuck slider 30 about a mounting piece 32, and a chuck cylinder 34 is also fixed to the chuck slider 30. A tapered member 35 is mounted to the end of the piston rod 34a of the chuck cylinder 34 so as to be in contact with a pair of rollers 36A, 36B provided at the rear ends of the holding levers 33A, 33B, respectively, to separate these rear ends as the piston rod 34a advances to close the forward ends of the levers 33A, 33B. A tension spring 58 is provided between the rear ends of the holding levers 33A, 33B, and another tension spring 37 (FIG. 1) is also provided in order to urge the chuck slider 30 in the upward direction. A positioning stop bolt 38 (FIG. 1) which defines the upper limit of the location of the chuck slider 30 is fixed to the frame 1 of the apparatus, and a feed adjustment bolt 39 (FIG. 1), adapted to come into contact with the chuck slider 30, is attached to the main slider 10 so that the chuck slider 30 will be moved downwardly during at least a portion of the downward strove of the main slider 10.

Figure 3:
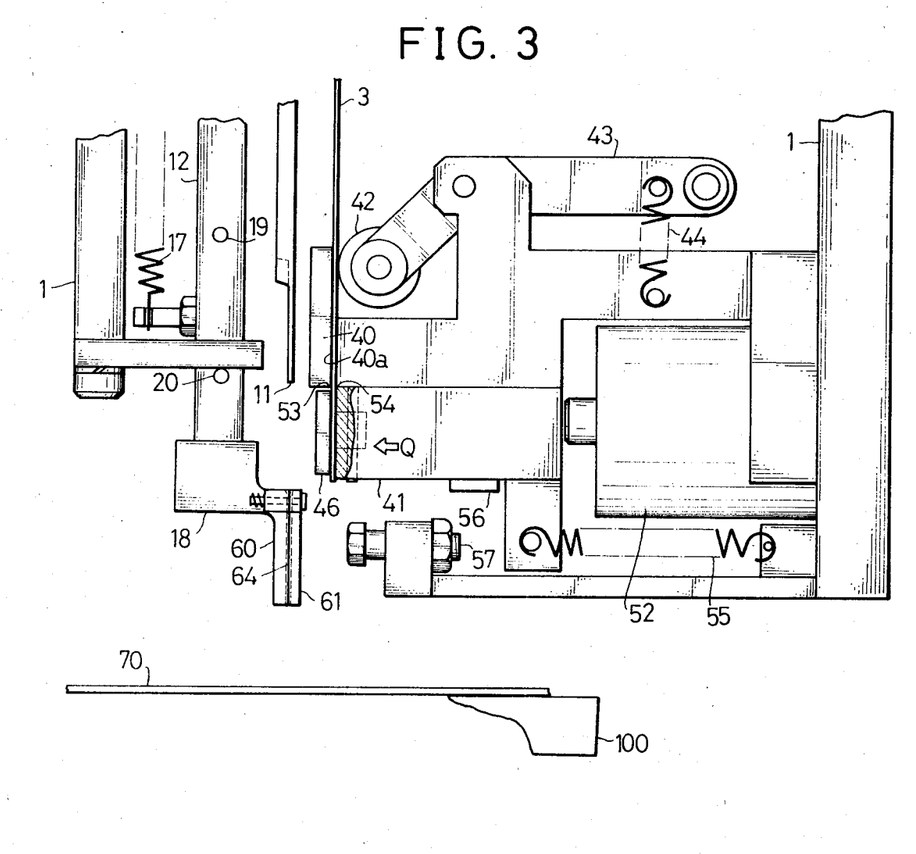
FIG. 3 is a front elevation view of a cutter mechanism and guide portion constituting component parts of the present invention.

Referring to FIG. 3, the cutter mechanism comprises a fixed cutter 40 attached to the frame 1 of the apparatus and a movable cutter 41 which is supported so that it is freely slidable horizontally with respect to the frame 1 of the apparatus by means of a cutter guide 56. The cutter mechanism also includes a rotatable uni-directional clutch 42 mounted so as to push the square pin-forming wire 3 against a guide surface 40a of the fixed cutter 40. The unidirectional clutch 42 is rotatable only in the direction in which the square pin wire 3 moves downward (counter-clockwise in FIG. 3), and is mounted on one end of a lever 43 which is pivotally mounted on the side of the frame. The lever 43 is activated by a tension spring 44 at the end of the lever 43 opposite from the clutch 42 in a direction such that it is pressed into contact with the guide surface 40a of the fixed cutter 40.

As best seen in FIGS. 4-7, the movable cutter 41 is provided with a square pin receiving groove 45 extending in the vertical direction, and an L-shaped square pin holder 46 pivotally mounted to movable cutter 41 at mounting 47 such that an end region thereof partially covers the square pin receiving groove 45. The movable cutter 41 is provided with a depression 48 which receives one end of a compression spring 51 the other end of which bears against the other end region of the L-shaped square pin holder 46 to actuate the latter in the direction in which it will hold a square pin 50 located in the groove 45. In addition, a cutter cylinder 52 (FIG. 3), which functions to advance the movable cutter 41 laterally, is mounted to the frame 1 of the apparatus.

The lower edge surface of the guide surface 40a of the fixed cutter 40 is shaped to function as a fixed blade 53, while the upper edge surface of the square pin receiving groove 45 of the movable cutter 41 functions as a movable blade 54. When the movable cutter 41 is advanced by the cutter cylinder 52, the square pin-forming wire 3 previously inserted in the square pin receiving groove 45 as described below is cut and a square pin 50 of the specified length is thereby formed and remains in the square pin receiving groove 45. A tension spring 55 is provided for retracting the movable cutter 41, while an adjustment bolt 57 limits the extent of movement of the movable cutter 41 so that the movable cutter 41 will be located immediately below the push rod 11 when it reaches its furthest advanced position.

Figure 4:
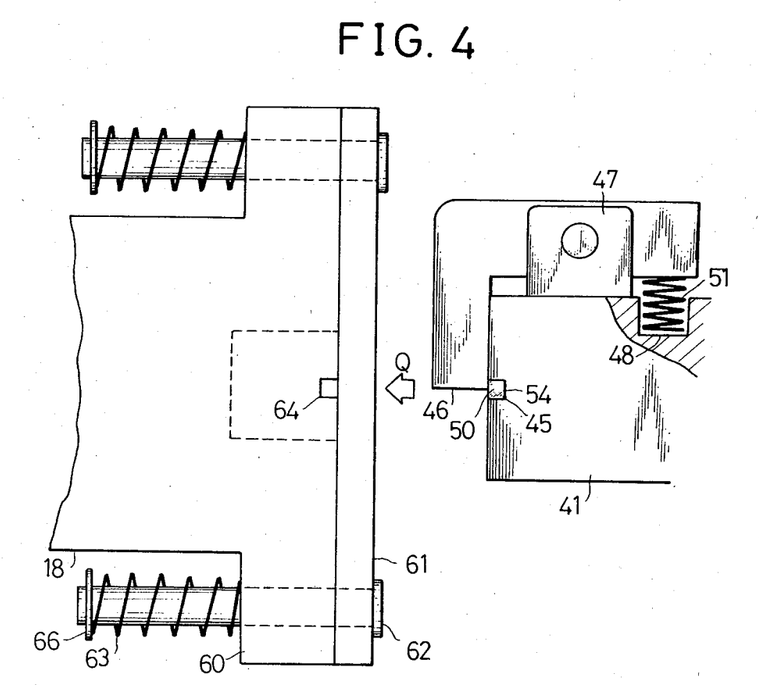
FIG. 4 is a plan view of the cutter mechanism and guide portion illustrated in FIG. 3.

Referring to FIGS. 3 and 4, the guide 18 comprises a cover 61 mounted to a block 60 by pins 62, the cover 61 being urged into contact with the side of block 60 under the force of compression springs 63. More particularly, each pin 62 passes through aligned openings formed in the block 60 and cover 61 and has a compression spring 63 provided around its periphery, the ends of each spring bearing against a stop ring 66 attached to the rear end of the pin 62 and the block, respectively. A vertically extending square pin guide groove 64 is formed in the surface of the block 60 facing the cover 61. This square pin guide groove 64 is positioned to receive a square pin 50 (FIG. 4) from the movable cutter 41 as the push rod 11 descends, the cover 61 clamping the square pin 50 within the square pin guide groove 64. The elastic support provided by the spring mounted cover 61 enables the guide to tolerate relatively large dimensional deviations in the cross-section of the square pin-forming wire as well as any bends or burrs in the square pin wire 3.

Figure 5:
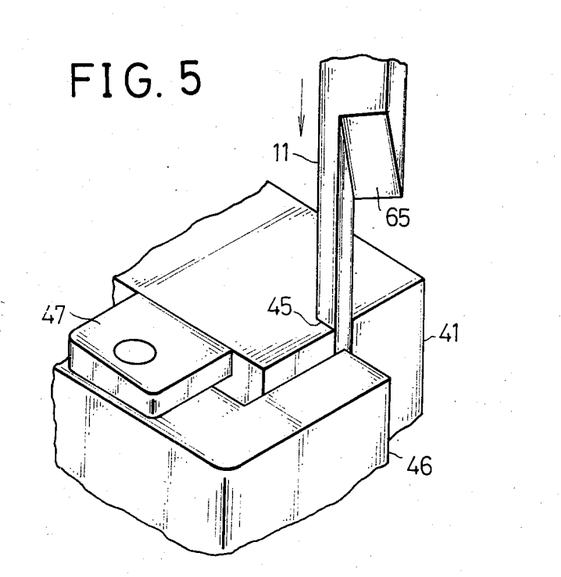
FIGS. 5 to 7 are perspective view of a movable cutter and push rod end constituting component parts of the present invention and illustrating their cooperation during successive stages of operation.
Figure 6:
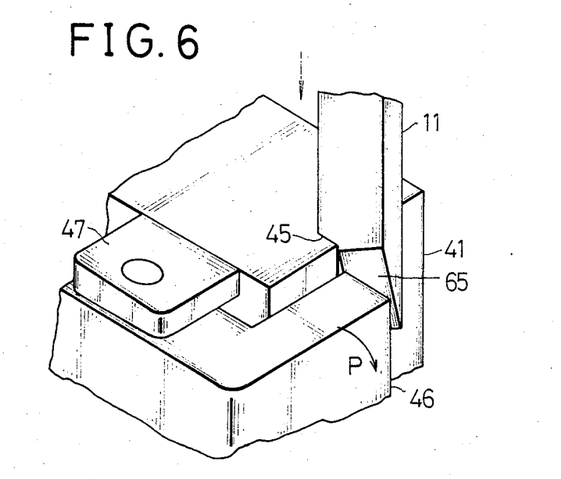
Figure 7:
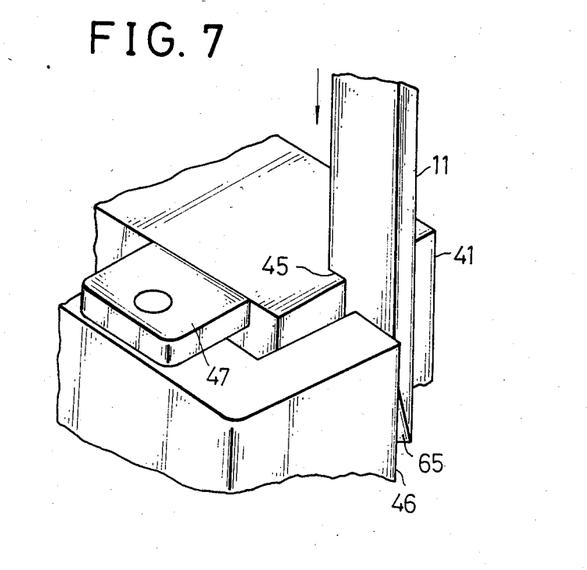

As shown in FIG. 5 to FIG. 7, the push rod 11 is provided with a tapered portion 65 near the lower end thereof. This tapered portion acts to cam open the square pin holder 46 of the movable cutter 41, i.e., to pivot the same in the direction indicated by the arrow P (FIG. 6) as the push rod descends.

Figure 8:
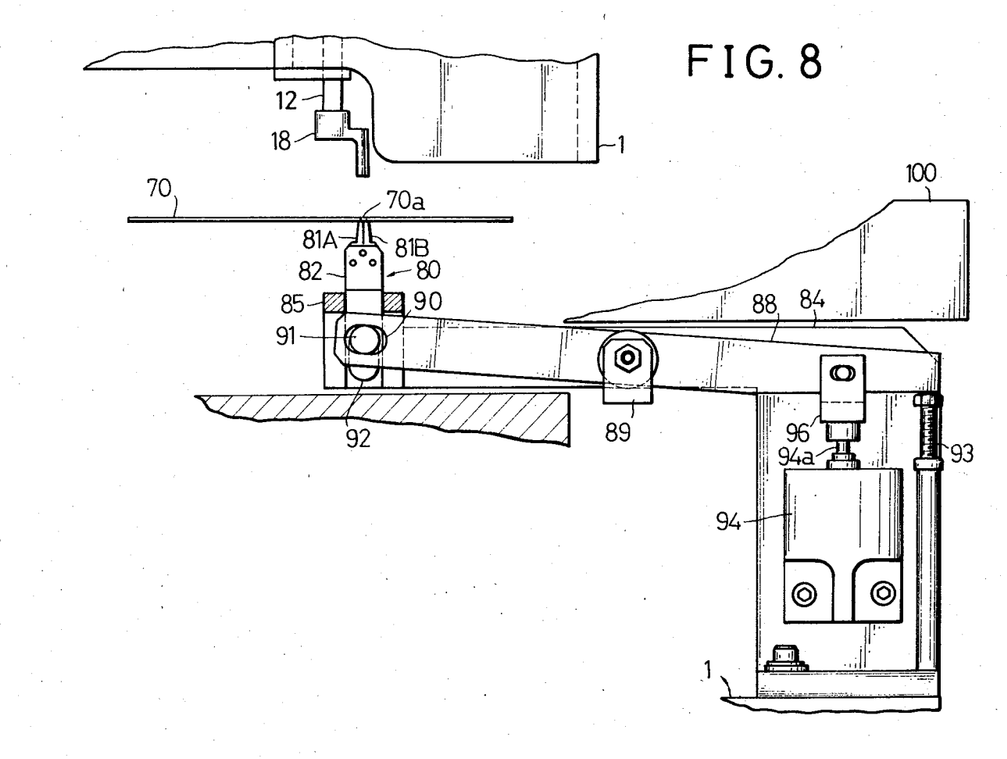
FIG. 8 is a front elevation view of the complete construction of a board-supporting portion constituting a component part of the present invention.
Figure 9:
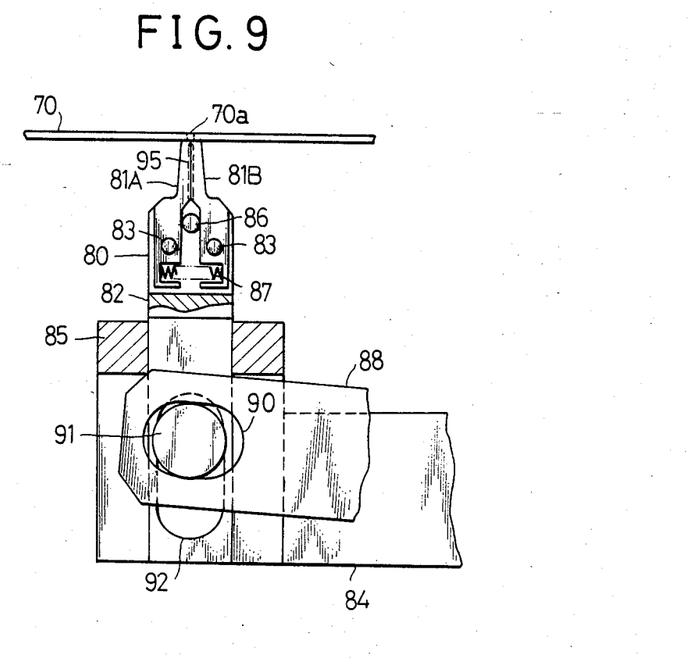
FIG. 9 is an enlarged front elevation view in partial section of the major parts of the board-supporting portion shown in FIG. 8.

A printed circuit board 70 into which the square pins 50 are to be inserted is supported below the guide 18 by an XY table 100. A board support means 80 is arranged under the printed circuit board 70. As shown in FIG. 8 and FIG. 9, this board support means 80 comprises a pair of board-supporting levers 81A, 81B mounted on a vertically movable block 82 by pins 83. The vertically movable block 82 is guided by a slide receiver 85 mounted to the side of frame by a fixed arm 84 so that the block 82 can freely slide in the vertical direction. A pin 86 attached to the vertically movable block 82 defines the center location of the pair of board-supporting levers 81A, 81B, and a compression spring 87, which acts to urge the board-supporting levers 81A, 81B in respective directions which close the front ends thereof, is provided between the rear ends of the levers. An operating lever 88 with an elongated slot 90 formed in one end is pivotally mounted at its center by a bracket 89. A pin 91 provided on the block 82 is located within the elongated slot 90, the pin 91 also being loosely received in an elongated vertical guide slot 92 formed in the slide receiver 85. The extent of pivotal movement of the operating lever 88 is limited by a stop bolt 93 mounted on the frame at the other end of the lever 88. The lever is coupled to a rod 94a of a board receiving operating cylinder 94 by a bracket 96. The stop bolt 93 and cylinder 94 are fixed to the side of the frame 1. The pair of board-supporting levers 81A, 81B are provided with receiving grooves 95 into which the square pin 50 is inserted. Thus, the levers 81A and 81B move upward along the slide receiver 85 to contact the lower surface of the board 70 to support the same when the rod 94a of cylinder 94 retracts in synchronization with the downward movement of the guide 18 to the upper surface of the board 70.

Figure 10:
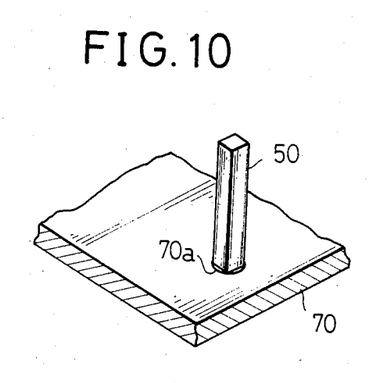
FIG. 10 is a perspective view showing a square pin inserted into a printed circuit board.

The operation of the above-described embodiment will now be explained. After a previous square pin insertion has been completed, the square pin-forming wire 3 stops in a position wherein a lower end portion thereof is situated in the square pin receiving groove 45 of the movable cutter 41 as seen in FIGS. 1–4. In this condition, the cutter cylinder 52 operates first to advance the movable cutter 41 in the direction indicated by the arrow Q (FIGS. 3 and 4) from its retracted position shown in FIGS. 1, 3 and 4, and simultaneously the master cylinder 2 also operates. In this manner, a square pin 50 is cut to the specified length from the end of the square pin-forming wire 3, the formed pin 50 being held by the movable cutter 41 and then transferred to a portion over and vertically aligned with the groove 64 of the guide 18. During this time, the square pin 50 cannot become dislodged from the pin receiving groove 45 because it is being pressed into the groove 45 by the L-shaped square pin holder 46. Thus, with the forward movement of the movable cutter 41 being completed, the push rod 11, the square pin receiving groove 45 and the square pin guide groove 64 are aligned in a straight line. As shown in FIG. 5, as the push rod 11 is moved downwardly by the operation of the main slider 10, the square pin 50 is pushed by the rod 11 from the groove 45 in the movable cutter 41 so as to become positioned in the aligned guide groove 64 of the guide 18. During this operation, the square pin holder 46 of the movable cutter 41 is opened in the direction indicated by the arrow P by the tapered surface 65 of the push rod 11 as shown in FIG. 6. As seen in FIG. 7, the square pin holder 46 is finally pivotted to a position wherein it will not obstruct the push rod 11 so that upon retraction of the piston of the cutter cylinder 52, the movable cutter 41 is able to return to its initial position under the force of the tension spring 55. The square pin 50 is positively held within the square pin guide groove 64 of the guide 18 under the pressure of the cover 61. As the main slider 10 continues to descend, the upper end of the slide bar 12 is engaged by the lower end of the receiving rod 15 and as a result both the push rod 11 and slide bar 12 move downwardly. Accordingly, the guide 18 carrying the square pin 50 moves downward to a position very close to the printed circuit board 70, as indicated by the arrow R (FIG. 1), the slide bar 12 being prevented from descending any further by the stop pin 19. At the same time, the board support means 80 is moved upwardly, as indicated by the arrow S (FIG. 1), by the retracting of the board receiving operating cylinder 94, resulting in the levers 81A and 81B being elevated to the position shown in FIG. 8 and FIG. 9 in which the board-supporting levers 81A, 81B contact the lower surface of the board 70. Thereafter, as the push rod 11 continues to descend, the square pin 50 in the guide 18 is pushed from the groove 64 and inserted into a hole 70a in the board 70 as shown in FIG. 10. The chuck cylinder 34 operates substantially simultaneously with the insertion of the square pin by the push rod 11 so that the chuck 31 holds the square pin-forming wire 3, the feed adjustment bolt 39 coming into contact with the chuck slider 30. As a result, the chuck slider 30 moves downwardly a specified distance and the next piece or end portion of square pin-forming wire 3 becomes situated in the groove 45 of the movable cutter 41. Thereafter, the chuck 31 is released, the main slider 10 is reset, and the chuck slider 30 also returns to its upper location. The insertion of the square pin 50 can be confirmed by clamping the portion of the square pin which protrudes below the lower surface of the board 70 with the pair of board-supporting levers 81A, 81B and then detecting the electrical continuity between the guide 18 and the board support means 80.

According to the above embodiment, with the movable cutter for cutting the square pin wire comprising a square pin receiving groove into which the end of the square pin-forming wire is inserted and an openable square pin holder which covers at least a part of the square pin receiving groove, and since the push rod which inserts the square pins into the board has a tapered portion which functions to open the square pin holder, the movable cutter is capable of retracting during the downward movement of the push rod through the square pin receiving groove to a position where it awaits the insertion of the next piece of square pin-forming wire.

Further, since the guide for holding the square pin above the board comprises a guide block and a cover which is elastically pressed in contact therewith, a reliable square pin insertion can be executed even if there are certain deviations in the dimensions, or bending or burrs in the square pin-forming wire being used.

Moreover, according to the above embodiment, since the square pin insertion location on the board is supported from below by a pair of board-supporting levers of a board support means, cracking of the board and separation of the circuit pattern printed thereon are effectively prevented. In addition, the insertion of the square pins can be detected reliably by holding the protruding lower end of a square pin, after it has been inserted into the board, between the board-supporting levers and detecting the electrical continuity between the guide and the board support means.

As explained previously, the present invention provides a square pin insertion apparatus which accomplishes a complete process from the cutting of the square pin-forming wire to the insertion of the cut square pin into a board within a single stroke of a master cylinder which performs the principal operations, and which also has an increased rate for the square pin insertion operation as well as a simplified the structure.

Obviously, numerous modifications and variations of the invention are possible in the light of the above teachings. It is therefor to be understood that within the scope of the claims annexed hereto, the invention may be practiced otherwise than as specifically disclosed herein.

What is claimed is:

1. Apparatus for inserting square pins into openings in a printed circuit board, comprising:
   a frame;
   a master cylinder mounted on said frame;
   a main slider mounted on said frame and coupled to said master cylinder for reciprocating movement including advancing and retracting strokes;
   a push rod mounted on said main slider for reciprocating movement therewith;
   a slide bar coupled to said main slider and adapted to be advanced therewith along at least a portion of its advancing stroke;
   guide means mounted on said slide bar;
   a chuck slider mounted on said frame for reciprocating movement and means for coupling said chuck slider and said main slider to advance said chuck slider along at least a portion of the advancing stroke of said main slider;
   chuck means mounted on said chuck slider for clamping a length of square pin-forming wire;
   a fixed cutter mounted on said frame;
   a movable cutter mounted for movement on said frame for cutting the square pin-forming wire in cooperation with said fixed cutter to form a square pin, said movable cutter including first means for positively grasping said holding the square pin cut from the square pin-forming wire;
   said guide means including second means for holding the square pin;
   means for laterally moving the square pin positively grasped and held in said first holding means of said movable cutter to a transfer position over and axially aligned with said second holding means of said guide means; and wherein
   said push rod is aligned with said transfer position and said second holding means of said guide means so that upon movement of said push rod during the advancing stroke of said main slider, said push rod transfers the square pin into said second holding means of said guide means;
   wherein said means for coupling said chuck slider for advancing the same comprise means for moving said chuck slider during the movement of said push rod as the latter transfers the square pin into said second holding means of said guide means and such that an end region of the square pin-forming wire is situated in said first holding means of said movable cutter;
   wherein said movable cutter includes a body member and wherein said first holding means comprise a square pin receiving groove formed in a surface of said movable cutter body and means for at least partially covering said receiving groove, and wherein said means for moving the square pin held in said first holding means to said transfer position include means for advancing said movable cutter to a position wherein said receiving groove is aligned with said push rod; and
   wherein said means for at least partially covering said receiving groove comprises a covering member movably mounted to said movable cutter and wherein said push rod includes a tapered cam portion adapted to move said covering member, upon contacting the same during the advancing movement of said push rod, to a position to allow said movable cutter to retract.

2. The combination of claim 1 further including printed circuit board support means adapted to be situated below a printed circuit board, said support means comprising a pair of movably mounted board-receiving levers having respective opposed clamping ends movable between open and closed position, actuation means for closing said clamping ends of said levers, and means for elevating said board-receiving levers when a square pin is being inserted from a lower to an upper position wherein said levers contact the lower surface of the printed circuit board and clamp a region of the square pin protruding beyond the lower surface of the printed circuit board.

3. Apparatus for inserting square pins into openings in a printed circuit board, comprising:
   a frame;
   a master cylinder mounted on said frame;
   a main slider mounted on said frame and coupled to said master cylinder for reciprocating movement including advancing and retracting strokes;
   a push rod mounted on said main slider for reciprocating movement therewith;
   a slide bar coupled to said main slider and adapted to be advanced therewith along at least a portion of its advancing stroke;
   guide means mounted on said slide bar;
   a chuck slider mounted on said frame for reciprocating movement and means for coupling said chuck slider and said main slider to advance said chuck slider along at least a portion of the advancing stroke of said main slider;
   chuck means mounted on said chuck slider for clamping a length of square pin-forming wire;
   a fixed cutter mounted on said frame;
   a movable cutter mounted for movement on said frame for cutting the square pin-forming wire in cooperation with said fixed cutter to form a square pin, said movable cutter including first means for positively grasping and holding the square pin cut from the square pin-forming wire;
   said guide means including second means for holding the square pin;
   means for laterally moving the square pin positively grasped and held in said first holding means of said movable cutter to a transfer position over and axially aligned with said second holding means of said guide means; and wherein
   said push rod is aligned with said transfer position and said second holding means of said guide means so that upon movement of said push rod during the advancing stroke of said main slider, said push rod transfers the square pin into said second holding means of said guide means;
   wherein said means for coupling said chuck slider for advancing the same comprise means for moving said chuck slider during the movement of said push rod as the latter transfers the square pin into said second holding means of said guide means and such that an end region of the square pin-forming wire is situated in said first holding means of said movable cutter; and wherein said guide means comprises a block member and wherein said second means for holding a square pin comprises a guide groove formed in a surface of said block member, a cover member situated over said groove, and means for elastically urging said cover over said guide groove to clamp a square pin in said guide groove.

4. The combination of claim 3 further including printed circuit board support means adapted to be situated below a printed circuit board, said support means comprising a pair of movably mounted board-receiving levers having respective opposed clamping ends movable between open and closed position, actuation means for closing said clamping ends of said levers, and means for elevating said board-receiving levers when a square pin is being inserted from a lower to an upper position wherein said levers contact the lower surface of the printed circuit board and clamp a region of the square pin protruding beyond the lower surface of the printed circuit board.

5. Apparatus for inserting square pins into openings in a printed circuit board, comprising:
   a frame;
   a master cylinder mounted on said frame;
   a main slider mounted on said frame and coupled to said master cylinder for reciprocating movement including advancing and retracting strokes;
   a push rod mounted on said main slider for reciprocating movement therewith;
   a slide bar coupled to said main slider and adapted to be advanced therewith along at least a portion of its advancing stroke;
   guide means mounted on said slide bar;
   a chuck slider mounted on said frame for reciprocating movement and means for coupling said chuck slider and said main slider to advance said chuck slider along at least a portion of the advancing stroke of said main slider;
   chuck means mounted on said chuck slider for clamping a length of square pin-forming wire;
   a fixed cutter mounted on said frame;
   a movable cutter mounted for movement on said frame for cuttting the square pin-forming wire in cooperation with said fixed cutter to form a square pin, said movable cutter including first means for holding the square pin cut from the square pin-forming wire and a body member;
   said first holding means including a square pin receiving groove formed in a surface of said movable cutter body member and means for at least partially covering said receiving groove, which comprise a covering member movably mounted to said movable cutter body member;
   said guide means including second means for holding the square pin;
   means for moving the square pin held in said first holding means of said movable cutter to a transfer position over and aligned with said second holding means of said guide means and comprising means for advancing said movable cutter to a position wherein said receiving groove is aligned with said push rod;
   said push rod including a tapered cam portion adapted to move said covering member, upon contacting the same during the advancing movement of said push rod, to a position to allow said movable cutter to retract; and
   wherein said push rod is aligned with said transfer position and said second holding means of said guide means so that upon movement of said push rod during the advancing stroke of said main slider, said push rod transfers the square pin into said second holding means of said guide means.

6. The combination of claim 5 further including printed circuit board support means adapted to be situated below a printed circuit board, said support means comprising a pair of movably mounted board-receiving levers having respective opposed clamping ends movable between open and closed position, actuation means for closing said clamping ends of said levers, and means for elevating said board-receiving levers when a square pin is being inserted from a lower to an upper position wherein said levers contact the lower surface of the printed circuit board and clamp a region of the square pin protruding beyond the lower surface of the printed circuit board.

7. Apparatus for inserting square pins into openings in a printed circuit board, comprising:
   a frame;
   a master cylinder mounted on said frame;
   a main slider mounted on said frame and coupled to said master cylinder for reciprocating movement including advancing and retracting strokes;
   a push rod mounted on said main slider for reciprocating movement therewith;
   a slide bar coupled to said main slider and adapted to be advanced therewith along at least a portion of its advancing stroke;
   guide means mounted on said slide bar;
   a chuck slider mounted on said frame for reciprocating movement and means for coupling said chuck slider and said main slider to advance said chuck slider along at least a portion of the advancing stroke of said main slider;
   chuck means mounted on said chuck slider for clamping a length of square pin-forming wire;
   a fixed cutter mounted on said frame;
   a movable cutter mounted for movement on said frame for cutting the square pin-forming wire in cooperation with said fixed cutter to form a square pin, said movable cutter including first means for holding the square pin cut from the square pin-forming wire;
   said guide means including a block member and second means for holding the square pin and comprising a guide groove formed in a surface of said block member, a cover member situated over said groove, and means for elastically urging said cover member over said guide groove to clamp the square pin in said guide groove;
   means for moving the square pin held in said first holding means of said movable cutter to a transfer position over and aligned with said second holding means of said guide means; and wherein
   said push rod is aligned with said transfer position and said second holding means of said guide means so that upon movement of said push rod during the advancing stroke of said main slider, said push rod transfers the square pin into said second holding means of said guide means.

8. The combination of claim 7 further including printed circuit board support means adapted to be situated below a printed circuit board, said support means comprising a pair of movably mounted board-receiving levers having respective opposed clamping ends movable between open and closed position, actuation means for closing said clamping ends of said levers, and means for elevating said board-receiving levers when a square pin is being inserted from a lower to an upper position wherein said levers contact the lower surface of the printed circuit board and clamp a region of the square pin protruding beyond the lower surface of the printed circuit board.

* * * * *